(12) United States Patent
Koja et al.

(10) Patent No.: US 12,353,229 B2
(45) Date of Patent: Jul. 8, 2025

(54) SLAVE CIRCUIT AND REMOTE CONTROL SYSTEM USING THE SAME

(71) Applicant: ROHM Co., LTD., Kyoto (JP)

(72) Inventors: Nozomu Koja, Kyoto (JP); Kohei Tanimitsu, Kyoto (JP)

(73) Assignee: ROHM Co., LTD., Kyoto (JP)

( * ) Notice: Subject to any disclaimer, the term of this patent is extended or adjusted under 35 U.S.C. 154(b) by 91 days.

(21) Appl. No.: 18/487,396

(22) Filed: Oct. 16, 2023

(65) Prior Publication Data
US 2024/0126312 A1    Apr. 18, 2024

(30) Foreign Application Priority Data
Oct. 18, 2022 (JP) ................................ 2022-167177

(51) Int. Cl.
| | |
|---|---|
| G05F 1/10 | (2006.01) |
| G05F 1/56 | (2006.01) |
| H02J 13/00 | (2006.01) |
| H03K 17/687 | (2006.01) |
| H04B 3/54 | (2006.01) |
| H03F 3/45 | (2006.01) |

(52) U.S. Cl.
CPC .......... *G05F 1/56* (2013.01); *H02J 13/00009* (2020.01); *H03K 17/687* (2013.01); *H04B 3/548* (2013.01); *H03F 3/45475* (2013.01)

(58) Field of Classification Search
None
See application file for complete search history.

(56) References Cited

U.S. PATENT DOCUMENTS

| | | | | |
|---|---|---|---|---|
| 6,079,622 | A * | 6/2000 | Goto ................... | G06K 19/0723 235/492 |
| 6,686,831 | B2 * | 2/2004 | Cook .................. | G05B 19/0423 323/273 |
| 6,731,728 | B2 * | 5/2004 | Hollenbach ......... | H04M 19/001 379/93.05 |
| 7,218,204 | B2 * | 5/2007 | Hayashi ............... | G05F 3/30 327/543 |
| 7,613,939 | B2 * | 11/2009 | Karam ................. | H04L 12/10 710/305 |
| 10,579,128 | B2 * | 3/2020 | Ngo ..................... | G06F 1/3287 |
| 11,378,992 | B2 * | 7/2022 | Hafizi ................. | G05F 1/468 |
| 11,797,038 | B2 * | 10/2023 | Jung ..................... | G11C 8/18 |

FOREIGN PATENT DOCUMENTS

JP         6808814         1/2021

* cited by examiner

*Primary Examiner* — Thomas J. Hiltunen
(74) *Attorney, Agent, or Firm* — CHIP LAW GROUP

(57) ABSTRACT

A slave circuit that is connected to a master circuit via a bus, receives a power supply voltage via the bus, and receives a communication signal superimposed on the power supply voltage includes a diode bridge circuit configured to rectify a voltage of the bus, a capacitor connection pin to which a capacitor is connected, a P-type transistor connected between an output of the diode bridge circuit and the capacitor connection pin, an operational amplifier having a first input configured to receive a feedback voltage, having a second input configured to receive a reference voltage, and having an output connected to a gate of the P-type transistor, a receiving circuit configured to receive the communication signal, a first switch connected between the gate and source of the P-type transistor, and a control unit configured to control the first switch by generating a control signal synchronous with the communication signal.

13 Claims, 9 Drawing Sheets

F I G . 7
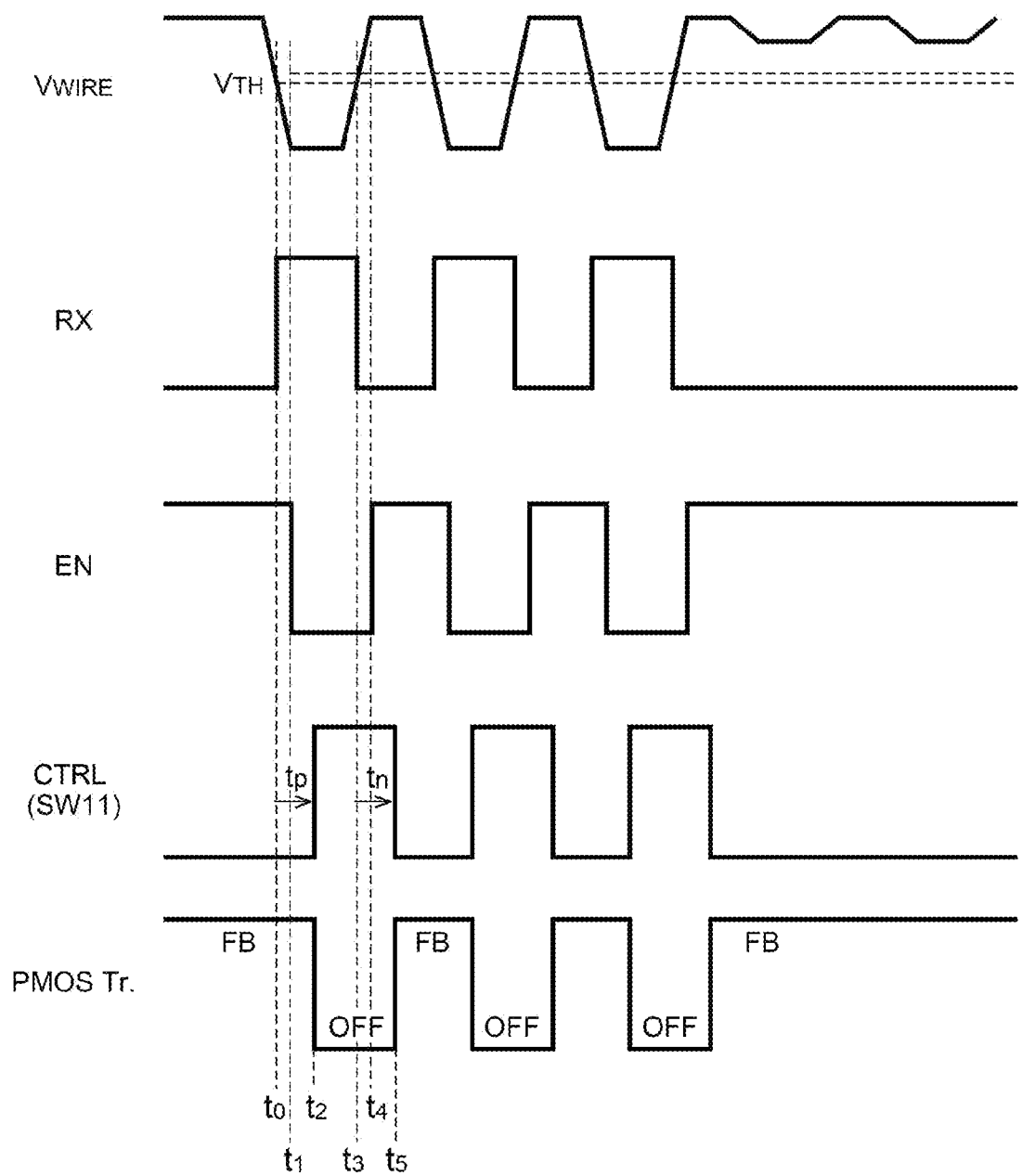

SLAVE CIRCUIT AND REMOTE CONTROL SYSTEM USING THE SAME

CROSS REFERENCE TO RELATED APPLICATIONS

This application claims priority benefit of Japanese Patent Application No. JP 2022-167177 filed in the Japan Patent Office on Oct. 15, 2022. Each of the above-referenced applications is hereby incorporated herein by reference in its entirety.

BACKGROUND

The present disclosure relates to a slave circuit controlled by a master circuit.

There is a system (referred to as a remote control system) in which communication is performed between a certain master circuit and one or a plurality of slave circuits connected to the master circuit, by modulating the voltage of a bus while supplying a power supply voltage from the master circuit to the slave circuit or circuits via the bus.

An example of the related art is disclosed in Japanese Patent No. 6808814.

BRIEF DESCRIPTION OF THE DRAWINGS

FIG. 7 is an operation waveform chart of the internal regulator circuit in FIG. 6;

DETAILED DESCRIPTION

Outline of Embodiments

Figure 1:
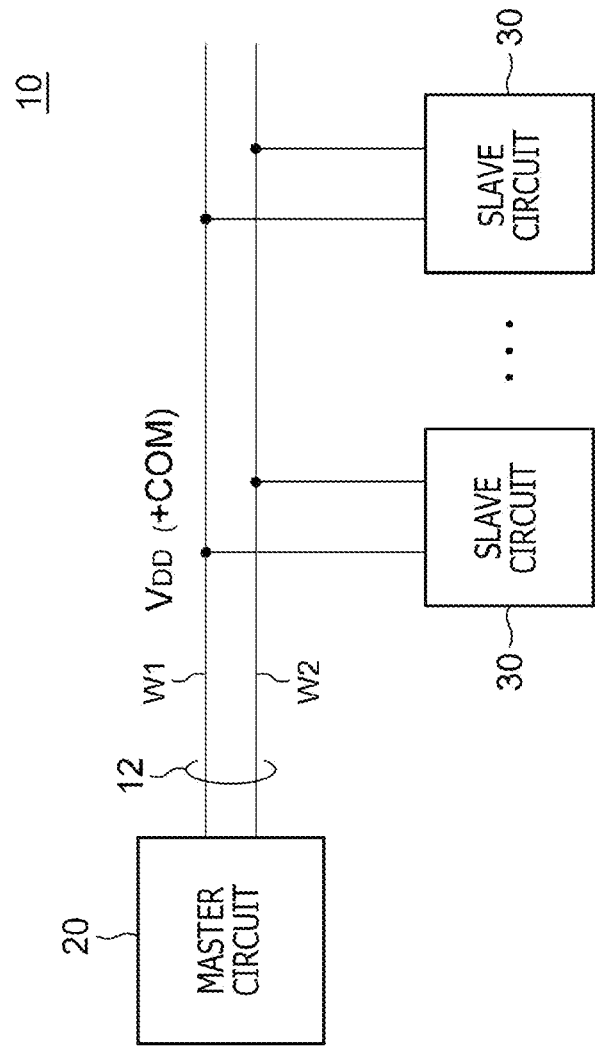
FIG. 1 is a block diagram of a remote communication system according to an embodiment.

An outline of a few illustrative embodiments of the present disclosure will be described. This outline describes, in a simplified manner, a few concepts of one or a plurality of embodiments as an introduction to the following detailed description for the purpose of basic understanding of the embodiments, and does not limit the scope of the present disclosure. This outline is neither a comprehensive outline of all conceivable embodiments nor intended to determine important elements of all of the embodiments or important elements or demarcate the scope of a part or all of aspects. For convenience, "one embodiment" may be used to refer to one embodiment (an example or a modification) or a plurality of embodiments (examples or modifications) disclosed in the present specification.

A slave circuit according to one embodiment is connected to a master circuit via a bus, receives a power supply voltage via the bus, and receives a communication signal superimposed on the power supply voltage. The slave circuit includes a diode bridge circuit configured to rectify a voltage of the bus, a capacitor connection pin to which a capacitor is connected, a P-type (Metal Oxide Semiconductor) transistor connected between an output of the diode bridge circuit and the capacitor connection pin, an operational amplifier having a first input configured to receive a feedback voltage corresponding to a voltage of the capacitor connection pin, having a second input configured to receive a reference voltage, and having an output connected to a gate of the P-type transistor, a receiving circuit configured to receive the communication signal on the basis of the voltage of the bus, a first switch connected between the gate and a source of the P-type transistor, and a control unit configured to control the first switch by generating a control signal synchronous with the communication signal.

During a period during which the communication signal occurs, the output of the diode bridge circuit, that is, the source voltage of the P-type transistor varies. In a case where the first switch is not present, when the response speed of the operational amplifier is slow, immediately after the source voltage of the P-type transistor makes a transition from a low to a high, the gate-to-source voltage of the P-type transistor is increased, the P-type transistor is set in a fully on state, a current flows into the capacitor via the P-type transistor, and consequently the voltage of the capacitor becomes higher than a target voltage. When the communication signal continues for a long period of time, the voltage of the capacitor rises gradually. In one embodiment, the first switch is switched in synchronism with the communication signal in such a manner that the P-type transistor is off at a timing at which the output voltage of the diode bridge circuit makes a transition from a low to a high. A rise in the voltage of the capacitor can thereby be suppressed.

In one embodiment, the slave circuit may further include a second switch connected between a drain of the P-type transistor and the capacitor connection pin. The control unit may control the second switch in a manner linked with the first switch. By turning off the second switch during an off interval of the P-type switch, it is possible to interrupt a charging path to the capacitor, and thus suppress a rise in the voltage of the capacitor.

A slave circuit according to one embodiment is connected to a master circuit via a bus, receives a power supply voltage via the bus, and receives a communication signal superimposed on the power supply voltage. The slave circuit includes a diode bridge circuit configured to rectify a voltage of the bus, a capacitor connection pin to which a capacitor is connected, a P-type (Metal Oxide Semiconductor) transistor connected between an output of the diode bridge circuit and the capacitor connection pin, an operational amplifier having a first input configured to receive a feedback voltage corresponding to a voltage of the capacitor connection pin, having a second input configured to receive a reference voltage, and having an output connected to a gate of the P-type transistor, a receiving circuit configured to receive the communication signal on the basis of the voltage of the bus, a second switch connected between a drain of the P-type transistor and the capacitor connection pin, and a control unit configured to control the second switch by generating a control signal synchronous with the communication signal.

With this configuration, the second switch is switched in synchronism with the communication signal in such a manner that the second switch is off at a timing at which the output voltage of the diode bridge circuit makes a transition from a low to a high. A rise in the voltage of the capacitor can thereby be suppressed.

In one embodiment, the operational amplifier may be switchable between an on state and an off state according to an enable signal. The control unit may generate the enable signal synchronous with the communication signal.

In one embodiment, the receiving circuit may compare the voltage of the bus with a threshold value and generate a received signal corresponding to a comparison result. The control unit may generate the control signal on the basis of the received signal.

In one embodiment, the control unit may generate the control signal by delaying edges of the received signal.

In one embodiment, the operational amplifier may be switchable between an on state and an off state according to an enable signal. The receiving circuit may compare the voltage of the bus with a threshold value and generate a received signal according to a comparison result. The control unit may generate the enable signal by delaying edges of the received signal by a first delay time period, and generate the control signal by delaying the edges of the received signal by a second delay time period longer than the first delay time period.

Embodiment

A preferred embodiment will hereinafter be described with reference to the drawings. Identical or equivalent constituent elements, members, and processing indicated in each drawing are identified by the same reference symbols, and repeated description thereof will be omitted as appropriate. In addition, the embodiment is not restrictive of the disclosure but is illustrative, and all features described in the embodiment and combinations thereof are not necessarily essential to the disclosure.

In the present specification, a "state in which a member A is connected to a member B" includes not only a case where the member A and the member B are physically directly connected to each other but also a case where the member A and the member B are indirectly connected to each other via another member that does not essentially affect a state of electric connection between the member A and the member B or does not impair functions or effects produced by the coupling of the member A and the member B.

Similarly, a "state in which a member C is connected (provided) between the member A and the member B" includes not only a case where the member A and the member C or the member B and the member C are directly connected to each other but also a case where the member A and the member C or the member B and the member C are indirectly connected to each other via another member that does not essentially affect a state of electric connection between the member A and the member C or the member B and the member C or does not impair functions or effects produced by the coupling of the member A and the member C or the member B and the member C.

FIG. 1 is a block diagram of a remote communication system 10 according to an embodiment. The remote communication system 10 includes a master circuit 20, a slave circuit 30, and a bus 12. The master circuit 20 and the slave circuit 30 are connected to each other via the bus 12. The bus 12 includes a first wire W1 and a second wire W2. The master circuit 20 supplies a direct-current power supply voltage (electric power) $V_{DD}$ to the slave circuit 30 via the bus 12. Specifically, the master circuit 20 generates a potential difference $V_{WIRE}$ corresponding to the power supply voltage $V_{DD}$ between the first wire W1 and the second wire W2. The potential difference $V_{WIRE}$ is not particularly limited and can be 5 V, 6 V, 8 V, 12 V, or 24 V, for example.

The slave circuit 30 is operable using the potential difference $V_{WIRE}$ between the first wire W1 and the second wire W2 as the power supply voltage $V_{DD}$. The master circuit 20 and the slave circuit 30 are able to communicate with each other via the bus 12. Specifically, the master circuit 20 transmits a signal to the slave circuit 30 by changing the potential difference $V_{WIRE}$ between the first wire W1 and the second wire W2. Voltage variation between the bus wires due to communication will be referred to as a communication signal COM. In addition, the slave circuit 30 also similarly transmits a signal to the master circuit 20 by changing the potential difference $V_{WIRE}$ between the first wire W1 and the second wire W2.

A plurality of slave circuits 30 may be connected to the bus 12. In that case, the plurality of slave circuits 30 are assigned identification numbers (IDs). The master circuit 20 embeds an identification number for identifying a communication partner in a head part (preamble) of a communication. Each of the plurality of slave circuits 30 determines that the slave circuit 30 itself is a communication target when the preamble of a received signal includes the identification number of the slave circuit 30 itself. The slave circuit 30 then responds to the signal from the master circuit 20.

Figure 2:
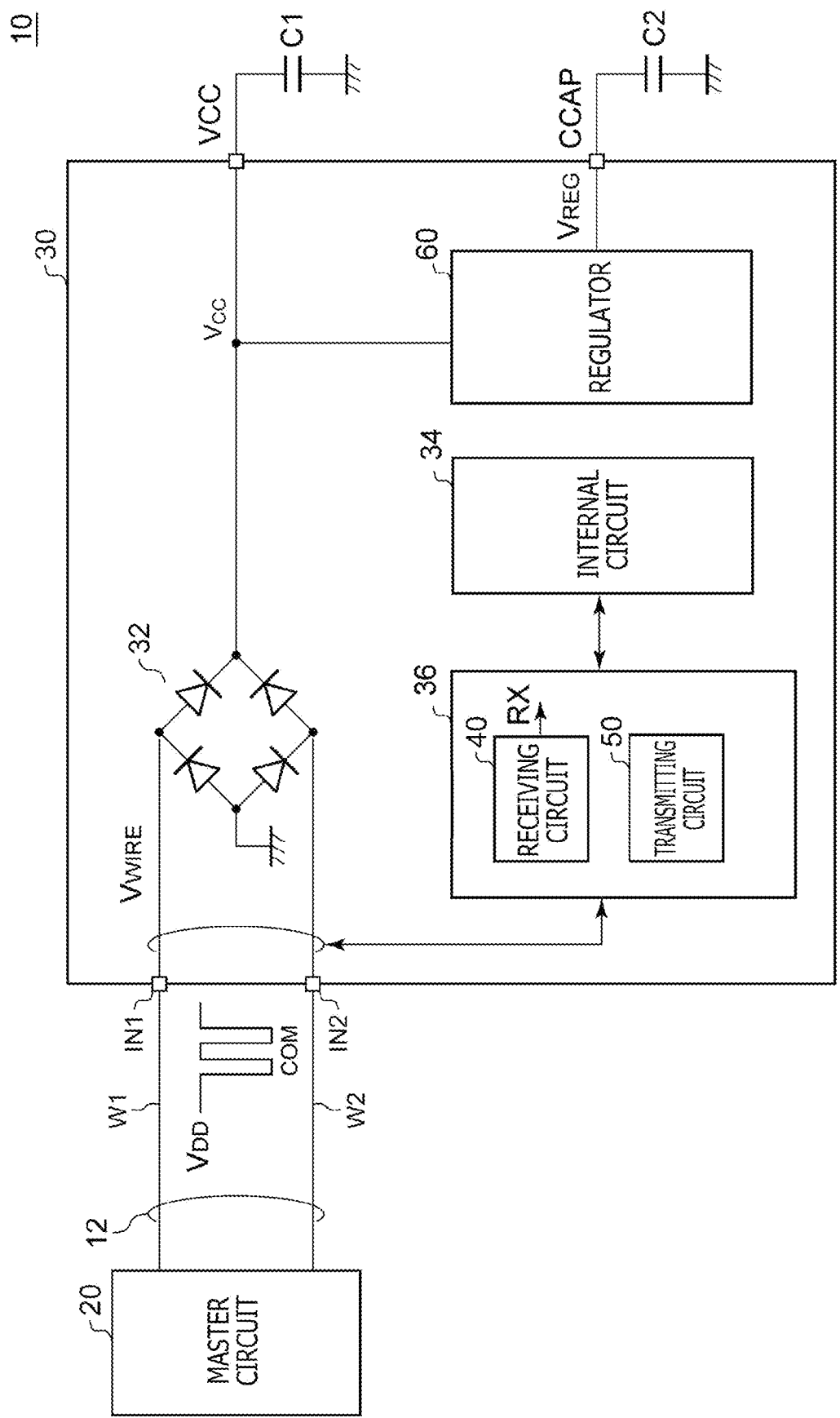
FIG. 2 is a circuit diagram of a slave circuit according to the embodiment.

FIG. 2 is a circuit diagram of the slave circuit 30 according to the embodiment. The slave circuit 30 includes a first input pin IN1, a second input pin IN2, a power supply pin VCC, a capacitor connection pin CCAP, a diode bridge circuit 32, an internal circuit 34, a communication circuit 36, and an internal regulator circuit 60. Capacitors C1 and C2 are externally attached to the VCC pin and the CCAP pin, respectively.

The slave circuit 30 is supplied with the power supply voltage $V_{DD}$ via the two wires W1 and W2. The communication signal COM is superimposed on the power supply voltage $V_{DD}$. Inputs of the diode bridge circuit 32 are connected to the first input pin IN1 and the second input pin IN2. The diode bridge circuit 32 full-wave rectifies the voltage between the two wires W1 and W2. A power supply voltage of the slave circuit 30 is generated by using a voltage $V_{CC}$ obtained after the rectification by the diode bridge circuit 32.

The internal circuit 34 has functions corresponding to an application of the slave circuit 30. The internal circuit 34 performs processing corresponding to a control command from the master circuit 20 and responds to an inquiry from the master circuit 20.

The communication circuit 36 receives a signal from the master circuit 20 and transmits a signal to the master circuit 20. The communication circuit 36 includes a receiving circuit 40 and a transmitting circuit 50. The master circuit 20 transmits a signal to the slave circuit 30 by changing the potential difference $V_{WIRE}$ between the two wires W1 and W2. Hence, the receiving circuit 40 is configured to be able to detect a change in the potential difference $V_{WIRE}$ between the two wires W1 and W2. For example, the receiving circuit 40 may include a comparator that compares the potential difference $V_{WIRE}$ with a threshold voltage $V_{TH}$ and binarizes the potential difference $V_{WIRE}$. The binarized signal will be referred to as a received signal RX. The receiving circuit 40 decodes the received signal RX.

The slave circuit 30 transmits a signal to the master circuit 20 in response to an inquiry from the master circuit 20. The transmitting circuit 50 is configured to be able to transmit a signal to the master circuit 20 by changing the potential difference $V_{WIRE}$ between the two wires W1 and W2.

An output of the internal regulator circuit 60 is connected to the capacitor C2 via the CCAP pin. The internal regulator circuit 60 receives the output voltage $V_{CC}$ of the diode bridge circuit 32 and generates an internal power supply voltage $V_{REG}$ stabilized at a predetermined voltage level.

The internal power supply voltage $V_{REG}$ is supplied as a power supply voltage to a few circuit blocks of the slave circuit 30.

Examples of configuration of the internal regulator circuit 60 will next be described on the basis of a few examples.

First Example

Figure 3:
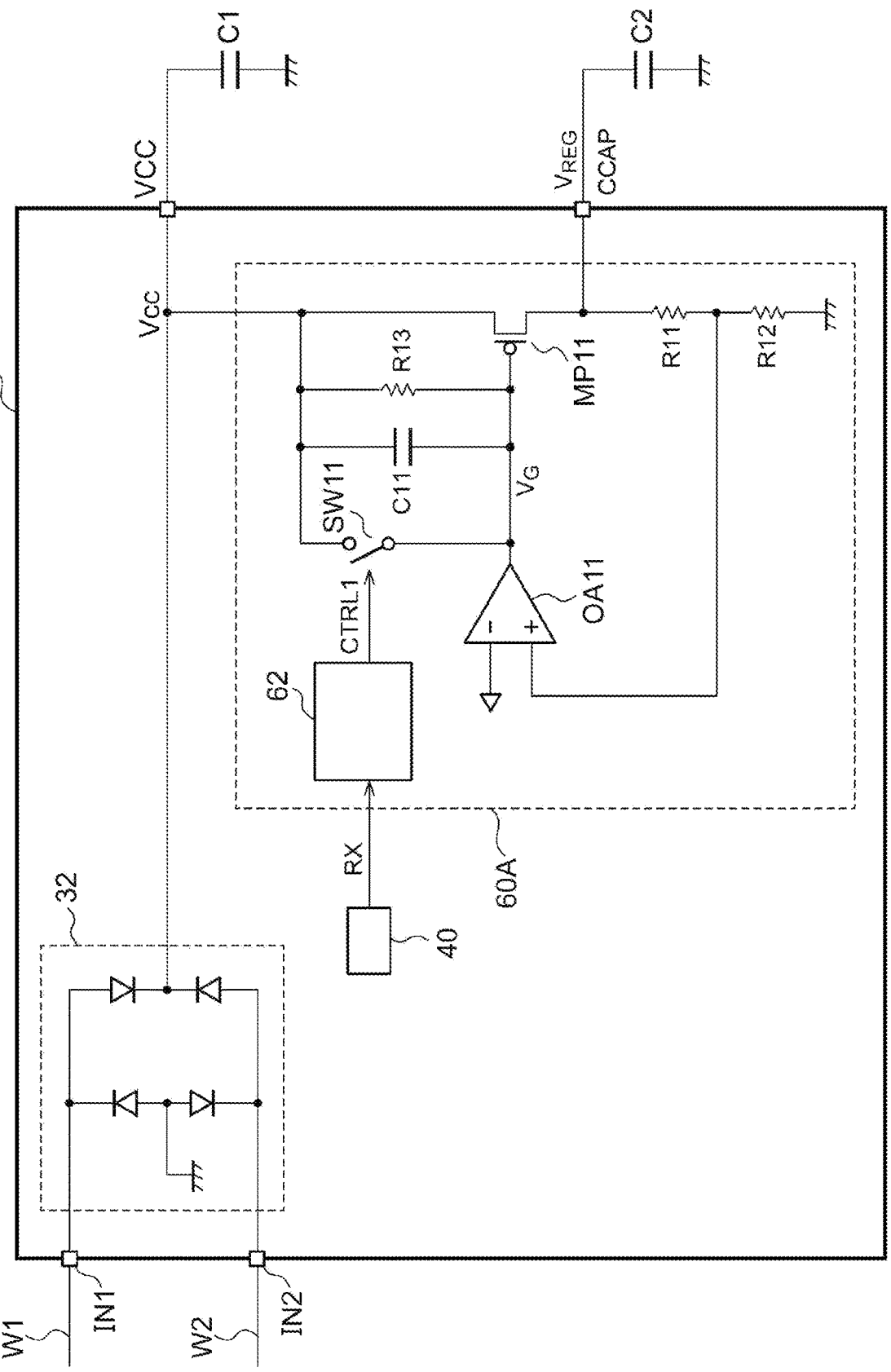
FIG. 3 is a circuit diagram of a slave circuit including an internal regulator circuit according to a first example.

FIG. 3 is a circuit diagram of the slave circuit 30 including an internal regulator circuit 60A according to a first example. The internal regulator circuit 60A includes a metal oxide semiconductor (PMOS) transistor MP11, an operational amplifier OA11, resistances R11, R12, and R13, a capacitor C11, a first switch SW11, and a control unit 62.

The capacitor C11 is connected to the capacitor connection pin CCAP. The PMOS transistor MP11 is connected between an output of the diode bridge circuit 32 and the capacitor connection pin CCAP. Specifically, a source of the PMOS transistor MP11 is connected to the output of the diode bridge circuit 32, and a drain of the PMOS transistor MP11 is connected to the capacitor connection pin CCAP.

The resistances R11 and R12 voltage-divide the voltage $V_{REG}$ of the capacitor connection pin CCAP, thereby generating a feedback voltage $V_{FB}$.

$$V_{FB} = V_{REG} \times R12/(R11+R12)$$

The operational amplifier OA11 receives the feedback voltage $V_{FB}$ corresponding to the voltage $V_{REG}$ of the capacitor connection pin CCAP at a first input (+), and receives a reference voltage $V_{REF}$ at a second input (−). An output of the operational amplifier OA11 is connected to a gate of the PMOS transistor MP11. The operational amplifier OA11 applies a feedback such that an error between the feedback voltage $V_{FB}$ and the reference voltage V REF is zero. This feedback stabilizes the output voltage $V_{REG}$ of the internal regulator circuit 60A at a target voltage level $V_{TGT}$, which is expressed by $V_{TGT} = V_{REF} \times (R11+R12)/R12$.

The first switch SW11 is connected between the gate and the source of the PMOS transistor MP11. The first switch SW11 can be switched on and off according to a control signal CTRL. In the present embodiment, suppose that the first switch SW11 is on when the control signal CTRL is high, and that the first switch SW11 is off when the control signal CTRL is low.

The capacitor C11 and the resistance R13 are connected between the gate and the source of the PMOS transistor MP11 and in parallel with the first switch SW11.

The control unit 62 generates the control signal CTRL synchronous with the communication signal COM superimposed on the power supply voltage $V_{DD}$ and controls the first switch SW11 by the control signal CTRL. For example, the control unit 62 is supplied with the received signal RX generated on the basis of the communication signal COM. The control unit 62 generates the control signal CTRL by using the received signal RX.

A configuration of the internal regulator circuit 60A has been described above. Operation of the internal regulator circuit 60A will next be described.

Before the description of the operation of the internal regulator circuit 60A, operation of an internal regulator circuit without the first switch SW11 (which internal regulator circuit is not illustrated but will be given a reference symbol 60R for convenience) will be described.

Figure 4:
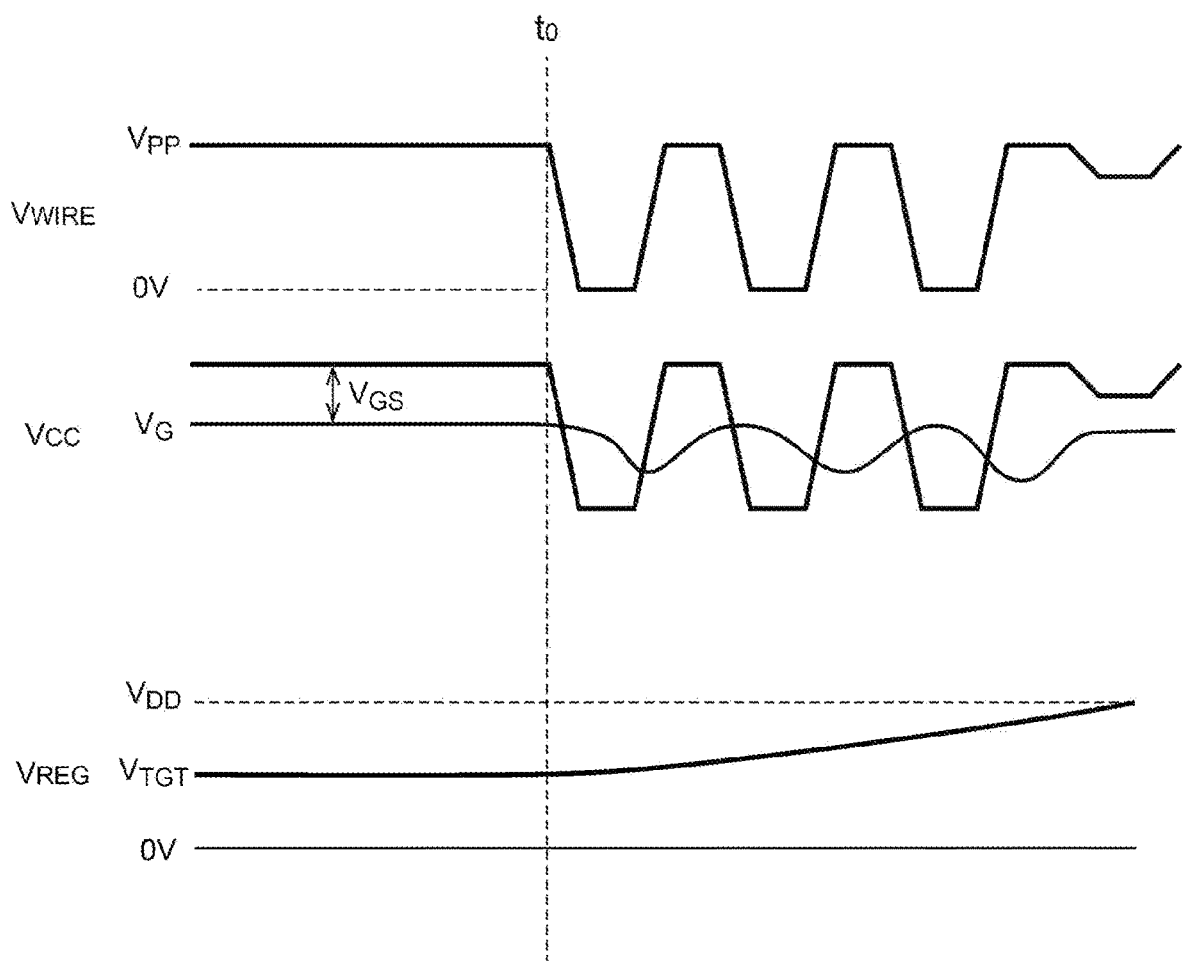
FIG. 4 is an operation waveform chart of an internal regulator circuit without a first switch.

FIG. 4 is an operation waveform chart of the internal regulator circuit 60R without the first switch SW11. FIG. 4 illustrates the inter-wire voltage $V_{WIRE}$, the output voltage $V_{CC}$ of the diode bridge circuit 32 and the gate voltage V G of the PMOS transistor MP11, and the output voltage $V_{REG}$ of the internal regulator circuit 60R. The output voltage $V_{CC}$ of the diode bridge circuit 32 is the source voltage of the PMOS transistor MP11. A potential difference between $V_{CC}$ and $V_G$ is therefore the gate-to-source voltage of the PMOS transistor MP11.

Before time to, no communication occurs, and the inter-wire voltage $V_{WIRE}$ is the power supply voltage $V_{DD}$. The gate voltage $V_G$ of the PMOS transistor MP11 is feedback-controlled to an appropriate voltage level by the operational amplifier OA11. The internal power supply voltage $V_{REG}$ is stabilized at an appropriate target voltage level $V_{TGT}$.

When a communication occurs at time to, the inter-wire voltage $V_{WIRE}$ varies between 0 V and $V_{DD}$. When the response speed of the operational amplifier OA11 of the internal regulator circuit 60R is slow, at a timing $t_1$ immediately after a transition of the inter-wire voltage $V_{WIRE}$ from 0 V to $V_{DD}$, the gate-to-source voltage of the PMOS transistor MP11 is increased, and the PMOS transistor MP11 is fully turned on. Consequently, a current flows into the capacitor C2 via the PMOS transistor MP11, and the output voltage $V_{REG}$ rises. When the communication continues, the output voltage $V_{REG}$ continues to rise.

Figure 5:
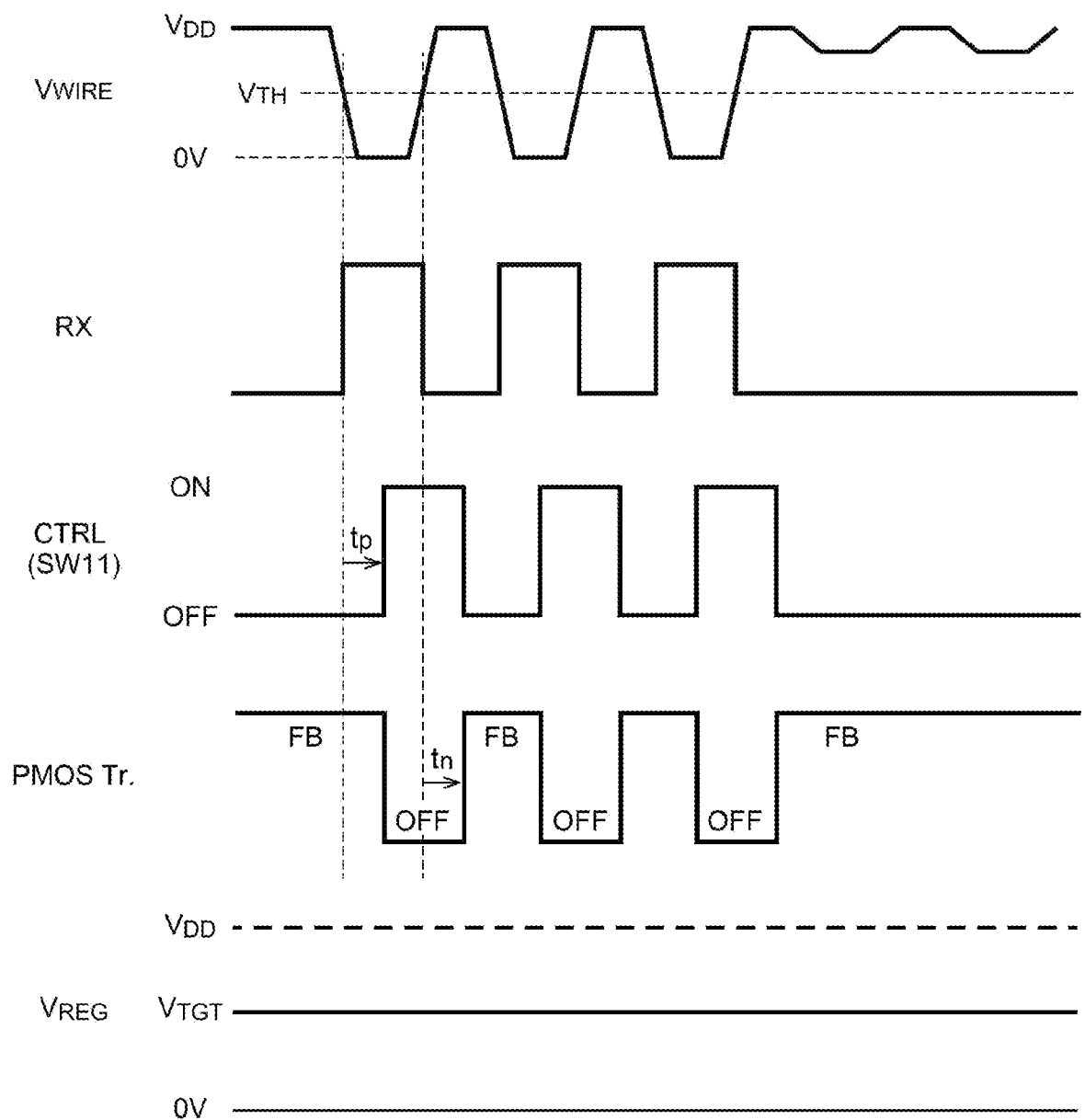
FIG. 5 is an operation waveform chart of the internal regulator circuit in FIG. 3.

FIG. 5 is an operation waveform chart of the internal regulator circuit 60A in FIG. 3. When the communication signal COM is transmitted from the master circuit 20, the inter-wire voltage $V_{WIRE}$ varies between $V_{DD}$ and 0 V. The receiving circuit 40 compares the inter-wire voltage $V_{WIRE}$ with the threshold voltage $V_{TH}$ and generates the received signal RX. The control unit 62 generates the control signal CTRL in synchronism with the received signal RX. Specifically, the control signal CTRL is generated by delaying edges of the received signal RX. The control signal CTRL makes a transition to a high after the passage of a delay time period τp from a positive edge of the received signal RX, and makes a transition to a low after the passage of a delay time period τn from a negative edge of the received signal RX.

During an interval during which the control signal CTRL is low, the first switch SW11 is off. Hence, the gate of the PMOS transistor MP11 is supplied with the output voltage $V_G$ of the operational amplifier OA11. A feedback is thus applied.

During an interval during which the control signal CTRL is high, the first switch SW11 is on. Thus, the gate and the source of the PMOS transistor MP11 are connected to each other, and the PMOS transistor MP11 is off.

The PMOS transistor MP11 is off at a timing at which the inter-wire voltage $V_{WIRE}$ makes a transition from a low to a high. Hence, even in the case where the response speed of the operational amplifier OA11 is slow, because the PMOS transistor MP11 is off, it is possible to prevent a current from flowing into the capacitor C2, and consequently suppress a rise in the output voltage $V_{REG}$ of the internal regulator circuit 60A.

Second Example

Figure 6:
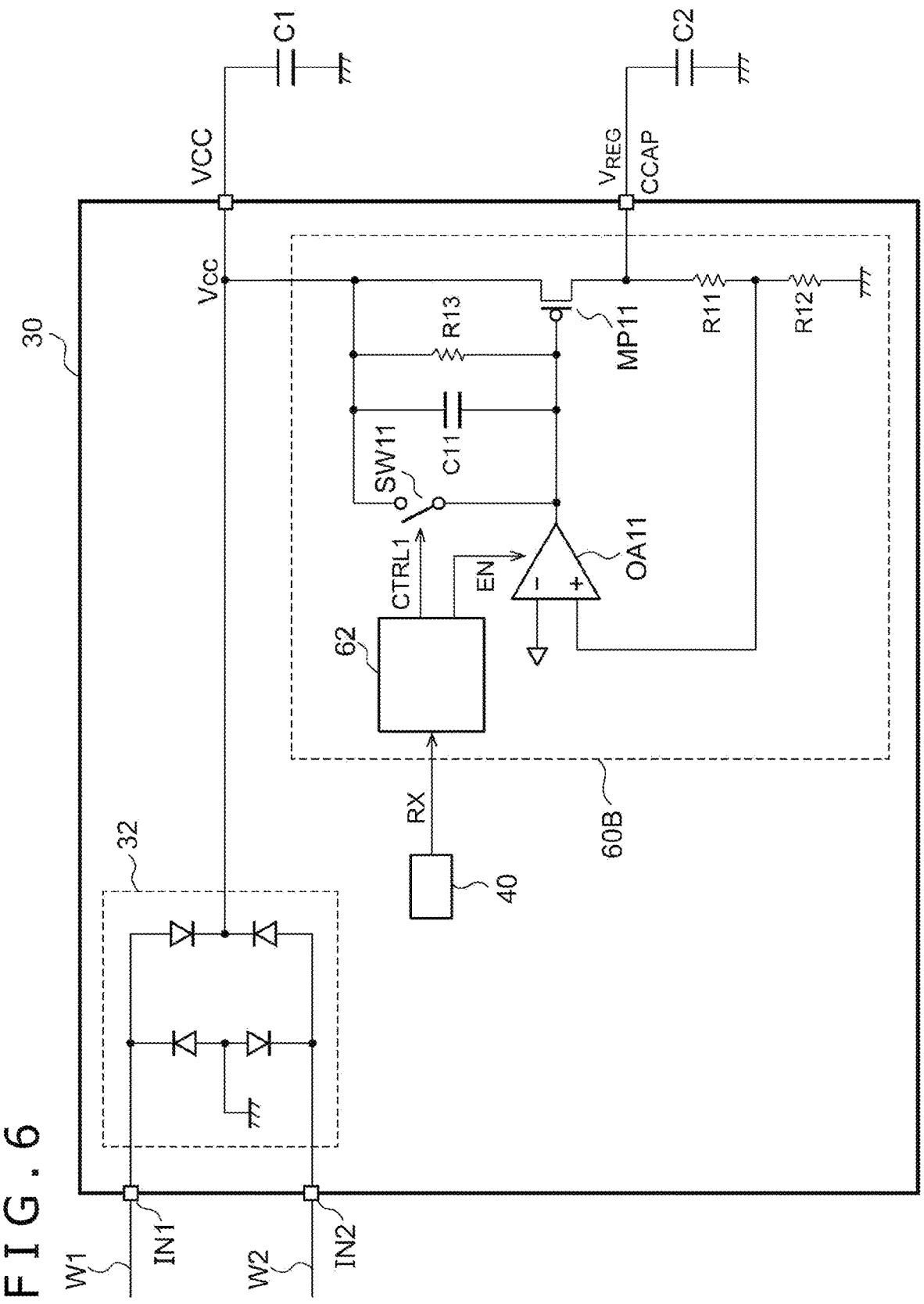
FIG. 6 is a circuit diagram of an internal regulator circuit according to a second example.

FIG. 6 is a circuit diagram of an internal regulator circuit 60B according to a second example. In the internal regulator circuit 60B, the operational amplifier OA11 can be switched between an on state and an off state according to an enable signal EN. The control unit 62 generates the enable signal EN in synchronism with the communication signal COM, specifically, in synchronism with the received signal RX. The control unit 62 thereby controls the operational amplifier OA11.

A configuration of the internal regulator circuit 60B has been described above. Operation thereof will next be described.

FIG. 7 is an operation waveform chart of the internal regulator circuit 60B in FIG. 6. When the received signal RX makes a transition from a low to a high at time to, that is, when the inter-wire voltage $V_{WIRE}$ makes a transition from $V_{DD}$ to 0 V, the enable signal EN makes a transition from a high to a low at an immediately succeeding time $t_1$. Thus, the operation of the operational amplifier OA11 is stopped, and the output of the operational amplifier OA11 has a high impedance. Power consumption can be reduced by stopping the operational amplifier OA11 while the inter-wire voltage $V_{WIRE}$ is 0 V. Then, at time $t_2$ after the passage of a delay time period τp, the control signal CTRL becomes high, and the first switch SW11 is thereby turned on. Consequently, the PMOS transistor MP11 is turned off.

When the received signal RX makes a transition from a high to a low at time $t_3$, that is, when the inter-wire voltage $V_{WIRE}$ makes a transition from 0 V to $V_{DD}$, the enable signal EN makes a transition from a low to a high at an immediately succeeding time $t_4$, so that the operation of the operational amplifier OA11 is resumed. Then, at time is after the operation of the operational amplifier OA11 is resumed, the control signal CTRL becomes low, and the first switch SW11 is thereby turned off.

Third Example

Figure 8:
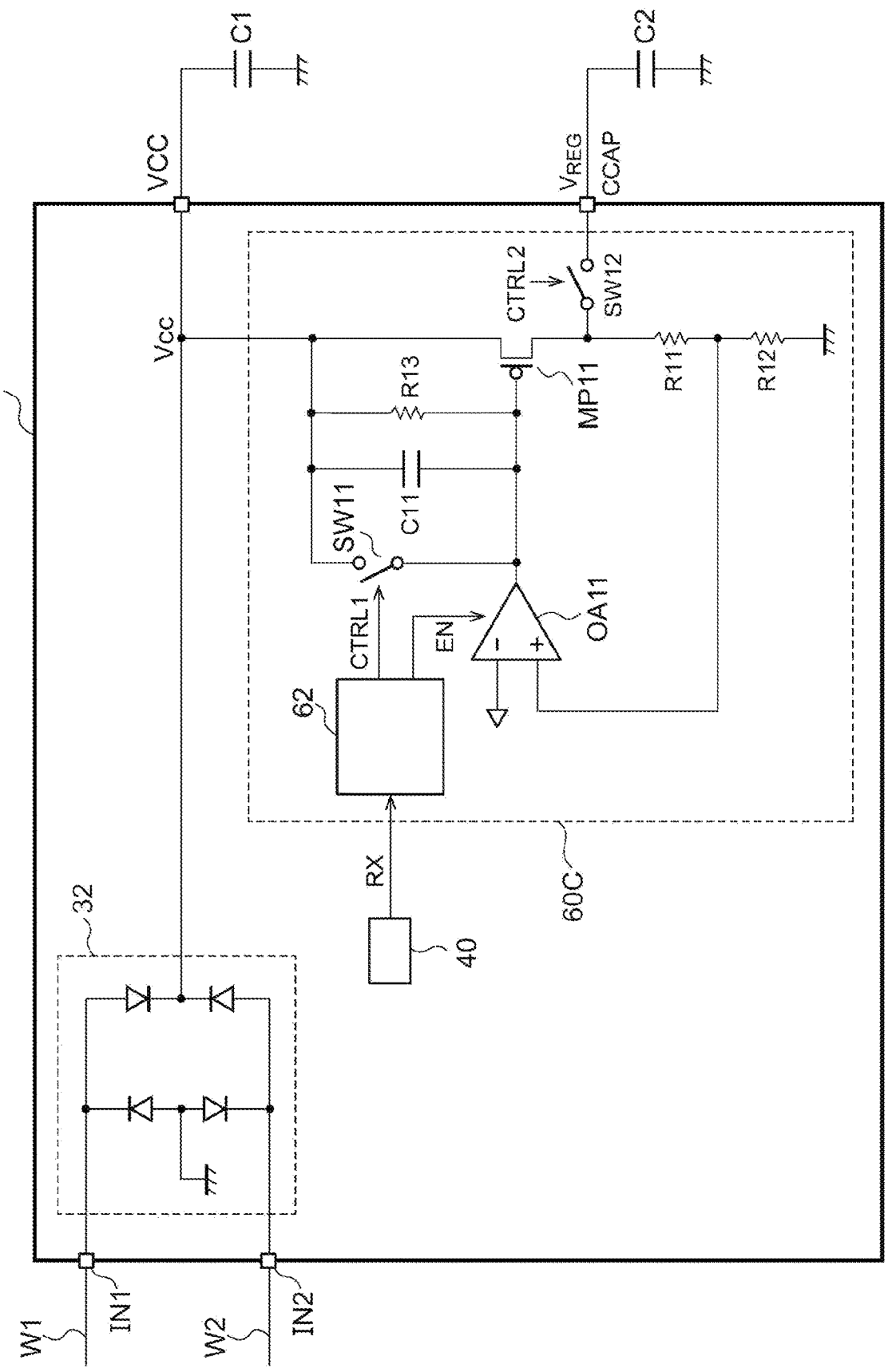
FIG. 8 is a circuit diagram of a slave circuit including an internal regulator circuit according to a third example.

FIG. 8 is a circuit diagram of a slave circuit 30 including an internal regulator circuit 60C according to a third example. The internal regulator circuit 60C includes a second switch SW12 in addition to the internal regulator circuit 60B in FIG. 6. The second switch SW12 is connected between the drain of the PMOS transistor MP11 and the capacitor connection pin CCAP. The second switch SW12 is controlled by a control signal CTRL2. The first switch SW11 and the second switch SW12 are controlled complementarily to each other.

A capacitor for phase compensation (not illustrated) is connected between the gate and the drain of the PMOS transistor MP11. At a time of a rise in the power supply voltage $V_{CC}$, when the first switch SW11 is turned off first and the second switch SW12 is subsequently turned on, the gate-to-source voltage of the PMOS transistor MP11 is increased, the PMOS transistor MP11 conducts, and a rush current flows in from a power supply line to the capacitor C2. In a case where the rush current presents a problem, at the time of the rise in the power supply voltage $V_{CC}$, the timings of a control signal CTRL1 and the control signal CTRL2 are preferably adjusted such that the second switch SW12 is turned on first and the first switch SW11 is subsequently turned off.

A configuration of the internal regulator circuit 60C has been described above. In the third example, when the control signal CTRL is low, the second switch SW12 is also turned off in addition to the PMOS transistor MP11. Thus, a charging path to the capacitor C2 is doubly interrupted. Consequently, a rise in the output voltage $V_{REG}$ of the internal regulator circuit 60C when the inter-wire voltage $V_{WIRE}$ rises from 0 V to $V_{DD}$ can be suppressed more reliably.

Fourth Example

Figure 9:
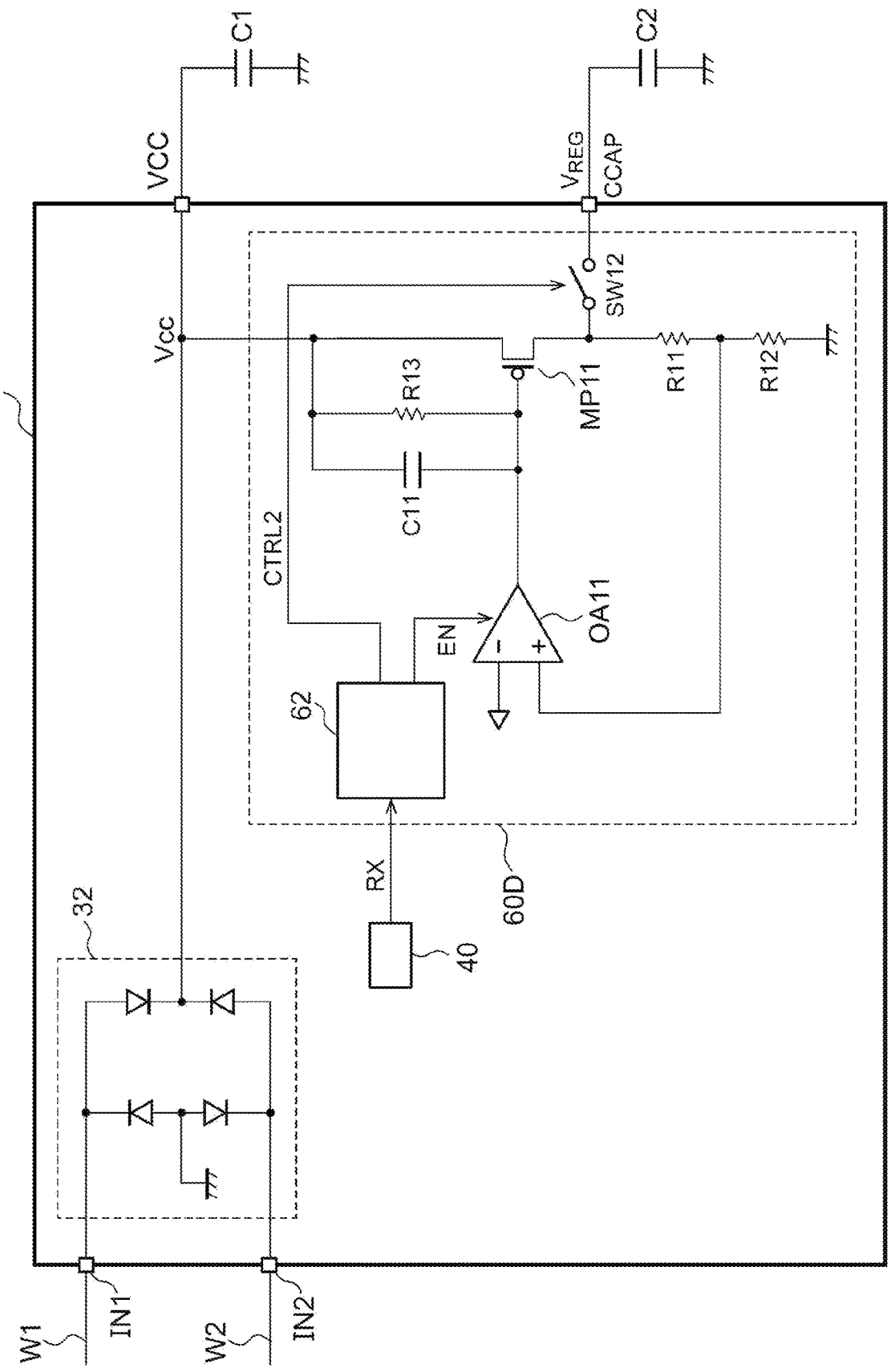
FIG. 9 is a circuit diagram of a slave circuit including an internal regulator circuit according to a fourth example.

FIG. 9 is a circuit diagram of a slave circuit 30 including an internal regulator circuit 60D according to a fourth example. The internal regulator circuit 60D is configured by omitting the first switch SW11 from the internal regulator circuit 60C in FIG. 8.

This configuration can also suppress a rise in the output voltage $V_{REG}$ of the internal regulator circuit 60C during a communication period.

Incidentally, the function of enabling/disabling the operational amplifier OA11 may be omitted in the third example and the fourth example.

The embodiments are illustrative, and it is to be understood by those skilled in the art that there are various modifications to combinations of respective constituent elements and respective processing processes of these embodiments, and that such modifications are also included in the present disclosure and can constitute the scope of the present disclosure.

(Supplementary Notes)

The following technology is disclosed in the present specification.

(Item 1)

A slave circuit that is connected to a master circuit via a bus, and that receives a power supply voltage via the bus and receives a communication signal superimposed on the power supply voltage, the slave circuit including:

a diode bridge circuit configured to rectify a voltage of the bus;

a capacitor connection pin to which a capacitor is connected;

a P-type transistor connected between an output of the diode bridge circuit and the capacitor connection pin;

an operational amplifier having a first input configured to receive a feedback voltage corresponding to a voltage of the capacitor connection pin, having a second input configured to receive a reference voltage, and having an output connected to a gate of the P-type transistor;

a receiving circuit configured to receive the communication signal on the basis of the voltage of the bus;

a first switch connected between the gate and a source of the P-type transistor; and a control unit configured to control the first switch by generating a control signal synchronous with the communication signal.

(Item 2)

The slave circuit according to item 1, further including:

a second switch connected between a drain of the P-type transistor and the capacitor connection pin, in which the control unit controls the second switch in a manner linked with the first switch.

(Item 3)

The slave circuit according to item 1 or 2, in which the operational amplifier is switchable between an on state and an off state according to an enable signal, and the control unit generates the enable signal synchronous with the communication signal.

(Item 4)
The slave circuit according to any one of items 1 through 3, in which
the receiving circuit compares the voltage of the bus with a threshold value and generates a received signal corresponding to a comparison result, and
the control unit generates the control signal on the basis of the received signal.

(Item 5)
The slave circuit according to item 4, in which
the control unit generates the control signal by delaying edges of the received signal.

(Item 6)
The slave circuit according to item 1 or 2, in which
the operational amplifier is switchable between an on state and an off state according to an enable signal,
the receiving circuit compares the voltage of the bus with a threshold value and generates a received signal according to a comparison result, and
the control unit generates the enable signal by delaying edges of the received signal by a first delay time period, and generates the control signal by delaying the edges of the received signal by a second delay time period longer than the first delay time period.

(Item 7)
A slave circuit that is connected to a master circuit via a bus, and that receives a power supply voltage via the bus and receives a communication signal superimposed on the power supply voltage, the slave circuit including:
a diode bridge circuit configured to rectify a voltage of the bus;
a capacitor connection pin to which a capacitor is connected;
a P-type transistor connected between an output of the diode bridge circuit and the capacitor connection pin;
an operational amplifier having a first input configured to receive a feedback voltage corresponding to a voltage of the capacitor connection pin, having a second input configured to receive a reference voltage, and having an output connected to a gate of the P-type transistor;
a receiving circuit configured to receive the communication signal on the basis of the voltage of the bus;
a second switch connected between a drain of the P-type transistor and the capacitor connection pin; and
a control unit configured to control the second switch by generating a control signal synchronous with the communication signal.

(Item 8)
The slave circuit according to item 7, in which
the operational amplifier is switchable between an on state and an off state according to an enable signal, and
the control unit generates the enable signal synchronous with the communication signal.

(Item 9)
The slave circuit according to item 7 or 8, in which
the receiving circuit compares the voltage of the bus with a threshold value and generates a received signal corresponding to a comparison result, and
the control unit generates the control signal on the basis of the received signal.

(Item 10)
The slave circuit according to item 9, in which
the control unit generates the control signal by delaying edges of the received signal.

(Item 11)
The slave circuit according to item 7, in which
the operational amplifier is switchable between an on state and an off state according to an enable signal,
the receiving circuit compares the voltage of the bus with a threshold value and generates a received signal according to a comparison result, and
the control unit generates the enable signal by delaying edges of the received signal by a first delay time period, and generates the control signal by delaying the edges of the received signal by a second delay time period longer than the first delay time period.

(Item 12)
A remote control system including:
a master circuit;
the slave circuit according to any one of items 1 through 11; and
a bus that connects the master circuit and the slave circuit to each other.

According to a certain aspect of the present disclosure, it is possible to stabilize the output voltage of a linear regulator circuit while reducing power consumption.

What is claimed is:
1. A slave circuit that is connected to a master circuit via a bus, and that receives a power supply voltage via the bus and receives a communication signal superimposed on the power supply voltage, the slave circuit comprising:
a diode bridge circuit configured to rectify a voltage of the bus;
a capacitor connection pin to which a capacitor is connected;
a P-type transistor connected between an output of the diode bridge circuit and the capacitor connection pin;
an operational amplifier having a first input configured to receive a feedback voltage corresponding to a voltage of the capacitor connection pin, having a second input configured to receive a reference voltage, and having an output connected to a gate of the P-type transistor;
a receiving circuit configured to receive the communication signal on a basis of the voltage of the bus;
a first switch connected between the gate and a source of the P-type transistor; and
a control unit configured to control the first switch by generating a control signal synchronous with the communication signal.

2. The slave circuit according to claim 1, further comprising:
a second switch connected between a drain of the P-type transistor and the capacitor connection pin, wherein
the control unit controls the second switch in a manner linked with the first switch.

3. The slave circuit according to claim 1, wherein
the operational amplifier is switchable between an on state and an off state according to an enable signal, and
the control unit generates the enable signal synchronous with the communication signal.

4. The slave circuit according to claim 1, wherein
the receiving circuit compares the voltage of the bus with a threshold value and generates a received signal corresponding to a comparison result, and
the control unit generates the control signal on a basis of the received signal.

5. The slave circuit according to claim 4, wherein
the control unit generates the control signal by delaying edges of the received signal.

6. The slave circuit according to claim 1, wherein
the operational amplifier is switchable between an on state and an off state according to an enable signal,
the receiving circuit compares the voltage of the bus with a threshold value and generates a received signal according to a comparison result, and
the control unit generates the enable signal by delaying edges of the received signal by a first delay time period, and generates the control signal by delaying the edges of the received signal by a second delay time period longer than the first delay time period.

7. A slave circuit that is connected to a master circuit via a bus, and that receives a power supply voltage via the bus and receives a communication signal superimposed on the power supply voltage, the slave circuit comprising:
   a diode bridge circuit configured to rectify a voltage of the bus;
   a capacitor connection pin to which a capacitor is connected;
   a P-type transistor connected between an output of the diode bridge circuit and the capacitor connection pin;
   an operational amplifier having a first input configured to receive a feedback voltage corresponding to a voltage of the capacitor connection pin, having a second input configured to receive a reference voltage, and having an output connected to a gate of the P-type transistor;
   a receiving circuit configured to receive the communication signal on a basis of the voltage of the bus;
   a second switch connected between a drain of the P-type transistor and the capacitor connection pin; and
   a control unit configured to control the second switch by generating a control signal synchronous with the communication signal.

8. A remote control system comprising:
   a master circuit;
   the slave circuit according to claim 1; and
   a bus that connects the master circuit and the slave circuit to each other.

9. The slave circuit according to claim 7, wherein
the operational amplifier is switchable between an on state and an off state according to an enable signal, and
the control unit generates the enable signal synchronous with the communication signal.

10. The slave circuit according to claim 7, wherein
the receiving circuit compares the voltage of the bus with a threshold value and generates a received signal corresponding to a comparison result, and
the control unit generates the control signal on a basis of the received signal.

11. The slave circuit according to claim 10, wherein
the control unit generates the control signal by delaying edges of the received signal.

12. The slave circuit according to claim 7, wherein
the operational amplifier is switchable between an on state and an off state according to an enable signal,
the receiving circuit compares the voltage of the bus with a threshold value and generates a received signal according to a comparison result, and
the control unit generates the enable signal by delaying edges of the received signal by a first delay time period, and generates the control signal by delaying the edges of the received signal by a second delay time period longer than the first delay time period.

13. A remote control system comprising:
   a master circuit;
   the slave circuit according to claim 7; and
   a bus that connects the master circuit and the slave circuit to each other.

* * * * *